(12) United States Patent
Wong

(10) Patent No.: US 6,658,617 B1
(45) Date of Patent: Dec. 2, 2003

(54) HANDLING A 1-HOT MULTIPLEXER DURING BUILT-IN SELF-TESTING OF LOGIC

(75) Inventor: Paul Wong, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/570,158

(22) Filed: May 11, 2000

(51) Int. Cl.[7] .............................. G01R 31/28; G06F 7/38
(52) U.S. Cl. ........................ 714/733; 714/734; 326/46
(58) Field of Search .................. 714/724, 726, 714/732, 733, 734, 738, 739, 742; 326/46, 40; 327/407

(56) References Cited

U.S. PATENT DOCUMENTS

| | | | |
|---|---|---|---|
| 4,860,290 A | | 8/1989 | Daniels et al. |
| 5,625,303 A | * | 4/1997 | Jamshidi ............ 326/106 |
| 5,875,346 A | | 2/1999 | Luick |
| 5,955,912 A | * | 9/1999 | Ko ..................... 327/410 |
| 5,991,909 A | | 11/1999 | Rajski et al. |
| 6,199,184 B1 | * | 3/2001 | Sim ................... 714/732 |
| 6,219,811 B1 | | 4/2001 | Gruetzner et al. |
| 6,327,687 B1 | | 12/2001 | Rajski et al. |
| 6,380,724 B1 | * | 4/2002 | Mahurin et al. ...... 324/73.1 |
| 6,380,780 B1 | | 4/2002 | Aitken et al. |
| 6,452,423 B1 | * | 9/2002 | Das et al. ............ 326/113 |

OTHER PUBLICATIONS

Nachman, L.; Saluja K.K.; Upadyaya, S.; Reuse, R.; Random pattern testing for sequential circuits revisited; Proceedings of Annual Symposium on Fault Tolerant Computing, Jun. 25–27, 1996.

Lin, C.–J.; Zorian Y.; Bhawmik, S.; PSBIST: A partial–scan based built in self–test scheme; Proceedings International Test Conference; Oct. 17–21, 1993, pp. 507–516.

* cited by examiner

Primary Examiner—Christine T. Tu
(74) Attorney, Agent, or Firm—Fenwick & West LLP

(57) ABSTRACT

An apparatus for obtaining valid values during a built-in self-testing of logic ("LBIST") is disclosed. The apparatus includes a first multiplexer, a second multiplexer and a 1-hot init circuit. The 1-hot init circuit includes a scan register, a first inverter, a third multiplexer, a second inverter, and a fourth multiplexer. The scan register includes a plurality of state elements. The first multiplexer is coupled to receive a random data signal and an output of the 1-hot init circuit. Within the 1-hot init circuit, a next to last and a last state element of the scan register is coupled to the inverters and the third and fourth multiplexers, respectively. The first inverter is also coupled to the third multiplexer and the second inverter is coupled to the fourth multiplexer. The output of the fourth multiplexer is coupled to the input of the second multiplexer. Also coupled to the input of the second multiplexer is an input for the random data signal. The output for the second multiplexer is coupled to a signature compression circuit. Also disclosed is a method for flushing the state elements in the 1-hot init circuit for receiving a 1-hot value after flush. Also disclosed is a method for ensuring values that a 1-hot multiplexer selects are orthogonal and that inputs to a signature compression circuit are valid.

29 Claims, 3 Drawing Sheets

HANDLING A 1-HOT MULTIPLEXER DURING BUILT-IN SELF-TESTING OF LOGIC

RELATED APPLICATIONS

The present application relates to the subject matter of co-pending U.S. application Ser. No. 09/695,749, filed by Paul Wong, et al., on Oct. 24, 2000, and to the subject matter of co-pending U.S. application Ser. No. 09/784,863, filed by Paul Wong, on Feb. 15, 2001.

BACKGROUND OF THE INVENTION

1. Field of the Invention

The present invention relates generally to built-in self-testing of logic ("LBIST"), and more particularly, to an apparatus and a method for handling 1-hot multiplexers during LBIST in an integrated circuit environment.

2. Description of Background Art

For high performance circuit designs, it is common to have outputs from a decoder, e.g., 2-to-4 decoder, feeding state elements, e.g., latches or flip-flops, which then feed select lines of the passgate multiplexers. For circuit designs that employ scans, the state elements are typically scannable.

During general system operation this configuration is acceptable because the system operates according to rules that ensure that the select lines of the passgate multiplexers are always orthogonal, i.e., only one of them is on. However, under test conditions, e.g., during a built-in self-testing of logic ("LBIST"), the scannable state elements get random data that no longer abides by the orthogonal rule. The LBIST process is a signature-based methodology that depends on deterministic results. At any given time during an LBIST test, the test responses must be known and are compressed into a structure that, based on a predefined polynomial, will produce a unique signature. This special structure is a multiple-input shift register ("MISR").

With regard to LBIST, a consequence of having either no select line in an on state or having multiple select lines in an on state causes a number of problems. For example, when no select line is in an on state, i.e., a 0-hot condition, the multiplexer will be floating. This results in a high current state that is detrimental to the reliability of the integrated circuit. If multiple select lines are in an on state, this will cause a problem with regard to contention of a node driven by a drive voltage, VDD, and ground. This will also result in a condition that is detrimental to the reliability of the integrated circuit. Thus, although each condition described would allow for safe operation of the system during system operation, the consequence of each condition during LBIST would be destruction of the validity of the LBIST results.

Therefore, there is a need for an apparatus and a method that allows for ensuring a 1-hot condition for a multiplexer during a built-in self-testing of logic in an integrated circuit.

SUMMARY OF THE INVENTION

In accordance with the present invention, there is provided an apparatus for obtaining valid values during a built-in self-testing of logic ("LBIST"). The apparatus includes a first multiplexer, a second multiplexer, and a 1-hot init circuit. The 1-hot init circuit includes a third multiplexer, a forth multiplexer, a scan register, a first inverter and a second inverter.

Each of the first, second, third, and fourth multiplexers include three inputs and an output. The first input of the first multiplexer and the first input of the second multiplexer are coupled to receive data signals from, for example, a pseudo-random pattern generator ("PRPG") for bits. The output of the first multiplexer is coupled to an input of the 1-hot init circuit. The output of the 1-hot init circuit is coupled to the second input of the second multiplexer and the second input of the first multiplexer. The output of the second multiplexer is coupled to a signature compression circuit, for example, a multiple input shift register.

Within the 1-hot init circuit, the scan register is coupled to the output of the first multiplexer to receive its output signal. The scan register includes state elements, for example logic flip flops, that receive data signals from a decoder. Each state element may have two inputs and two outputs. An output of a next to last state element is coupled with the first inverter and to a second input of the third multiplexer. The output of the first inverter is coupled to the first input of the third multiplexer.

The output of the third multiplexer is coupled to an input of a last state element. An output of this last state element is coupled to the second input of the fourth multiplexer and an input of the second inverter. The output of the second inverter is coupled to the first input of the fourth multiplexer. The output of the fourth multiplexer is coupled to the second input of the second multiplexer.

For a proper 1-hot initialization, when an input signal (or 1-hot initialization signal) is asserted high (or logical 1 or supply voltage, VDD) a signal is inverted when going through the last two elements of the scan register, the first inverter, the third multiplexer, the second inverter, and the fourth multiplexer within the 1-hot init circuit. This becomes an input for the third multiplexer. Under a flush condition (i.e., the scan clocks to the state elements of the scan register are both asserted and scan in input is held to a logical zero (or ground)) all but the last state element in the scan register will be flushed to zero while the last state element receives a value of one due to the inversion by the second inverter. This causes the output signal from the fourth multiplexer to be a logical zero. Thus, the scan register receives a 1-hot value (e.g., a "0001" with four state elements in the scan register) after a flush. This ensures that the values a 1-hot multiplexer selects are orthogonal and the output from the second multiplexer is valid.

It is noted that the first and the second multiplexers provide a means to allow 1-hot initialization during flush. It may also ensure 1-hot values in the scan register during LBIST by allowing a 1-hot value to re-circulate between the output of the first multiplexer, the output of the 1-hot init circuit, and back to the input of the scan register of the 1-hot init circuit.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE PREFERRED EMBODIMENTS

The figures depict a preferred embodiment of the present invention for purposes of illustration only. One of skill in the art will readily recognize from the following discussion that alternative embodiments of the structures and methods disclosed herein may be employed without departing from the principles of the claimed invention.

Figure 1:
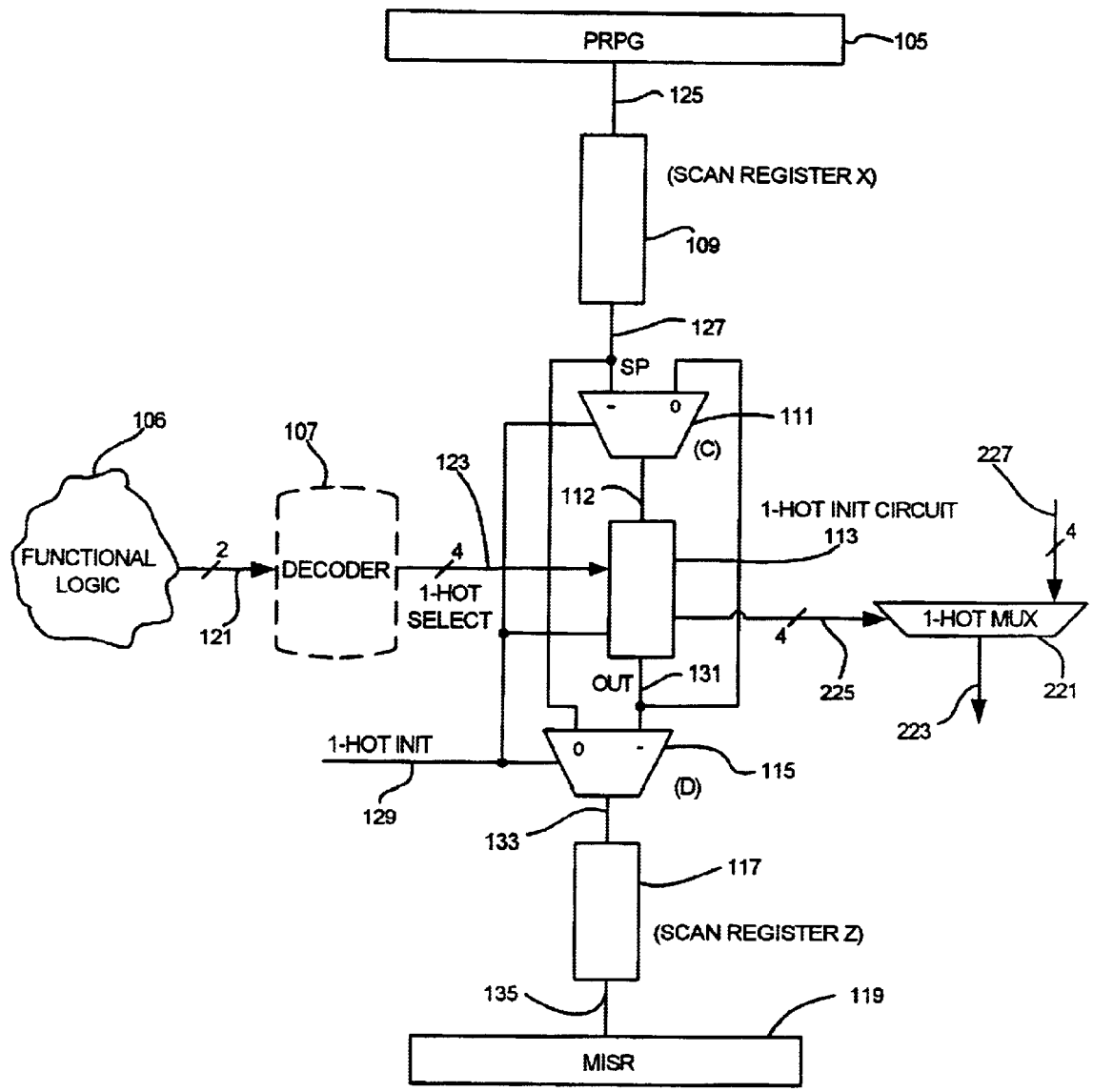
FIG. 1 is a circuit diagram of one embodiment of a system having a 1-hot apparatus for built-in self-testing of logic ("LBIST") in accordance with the present invention.

The present invention includes an apparatus and a method for obtaining valid values during a built-in self-testing of logic ("LBIST"). FIG. 1 is a circuit diagram of one embodiment of system 101 having a 1-hot apparatus for built-in self-testing of logic ("LBIST") in accordance with the present invention. The system 101 includes a pseudo-random pattern generator ("PRPG") 105, functional logic 106, a decoder 107, a scan register X (generally, a scan register) 109, a first multiplexer 111, a 1-hot init circuit 113, a second multiplexer 115, a scan register Z (generally, a scan register) 117, and a multiple input shift register ("MISR") 119. Also illustrated is a 1-hot multiplexer 221 having multiple inputs lines 225, 227 and an output line 223.

The pseudo-random pattern generator 105 is conventional. The functional logic 106 is conventional, for example, random or combinational logic on a microchip. The functional logic 106 may include, for example, logic latches or logic flip-flops. The decoder 107 is conventional and may include, for example, an x-bit to $2^x$-bit decoder. The scan register X 109 and the scan register Z 117 are conventional. The scan register X 109 and the scan register Z 117 may include, for example, scannable logic latches or scannable logic flip-flops. It is noted that these elements 109, 117 are optional in the system 101. The multiple input shift register 119 is conventional and may also include a conventional signature compression circuit.

The first multiplexer 111 (also labeled 'C') includes a first and a second input (labeled '0' and '1', respectively) and a selection input. The first multiplexer 111 also includes an output. Similarly, the second multiplexer 115 (also labeled 'D') includes a first and a second input (labeled '0' and '1', respectively) and a selection input. The second multiplexer 115 also includes an output.

The system in FIG. 1 can be described as having a scan path and a functional path. The scan path is illustrated in the vertical direction. In one embodiment the scan path includes the pseudo-random pattern generator 105, the optional scan register X 109, the first multiplexer 111, the 1-hot init circuit 113, the second multiplexer 115, the optional scan register Z 117, and the multiple input shift register 119. The functional path is illustrated in the horizontal direction. In one embodiment the horizontal path includes the functional logic 106, the decoder 107, the 1-hot init circuit 113, and the 1-hot multiplexer 221. It is noted that in one embodiment only one path operates at a given time.

In terms of an overall configuration involving both the scan path and the functional path, in one embodiment, the pseudo-random pattern generator 105 couples with the scan register X through a PRPG output signal line 125. The scan register X 109 couples with the second input of the first multiplexer 111 through a scan path line 127. It is noted that if the optional scan register X 109 were not present, the scan path line 127 would couple directly with the pseudo-random pattern generator 105. The first input of the first multiplexer 111 will be further discussed below.

The first multiplexer 111 also includes a selection input from a 1-hot init signal line 129. The output from the first multiplexer 111 depends upon whether the 1-hot init signal along the 1-hot init signal line 129 is a logic low (0 or ground) or high (1 or Vdd). The output of the first multiplexer 111 couples the 1-hot init circuit 113 through a first multiplexer output signal line 112.

The 1-hot init circuit 113 also receives inputs from the decoder 107 and the 1-hot init signal line 129. The 1-hot init circuit 113 sends outputs to the first multiplexer 111, the second multiplexer 115, and the 1-hot multiplexer 221. More specifically, the functional logic 106 couples with the decoder through an x-bit signal line 121. The x-bit signal line 121 is, for example, a 2-bit signal line. The decoder 107 couples with the 1-hot init circuit 113 through a $2^x$-bit signal line. For a 2-bit signal line input into the decoder 107, the output from the decoder 107 to the $2^x$-bit signal line is, for example, a 4-bit 1-hot select line 123.

One output from the 1-hot init circuit 113 couples with the 1-hot multiplexer 221 through a 1-hot selection input line 225. In one embodiment the 1-hot selection input line 225 is a 4-bit input line. The 1-hot multiplexer 221 also couples with input signal lines, e.g., a 4-bit input signal line 227, and an output signal line 223.

Referring back to the 1-hot init circuit 113, another output signal line 131 from the 1-hot init circuit 113 couples with a second input of the second multiplexer 115 and the first input of the first multiplexer 111. The first input of the second multiplexer 115 couples the signal path line 127. In addition, the second multiplexer couples with the 1-hot init signal line 129. The 1-hot init signal line 129 functions to provide an input select line for both the first and the second multiplexers 111, 115. For example, a 1-hot init signal along this line 129 determines if a signal from the first input or the second input of the second multiplexer 115 passes through to the output of the second multiplexer 115.

The output of the second multiplexer 115 couples the scan register Z 117 through a second multiplexer output signal line 133. The scan register Z 117 couples with the multiple input shift register 119 through a scan register output line 135. It is noted that if the optional scan register Z 117 is not present, the second multiplexer output signal line 133 couples with the multiple input shift register 119.

Figure 2:
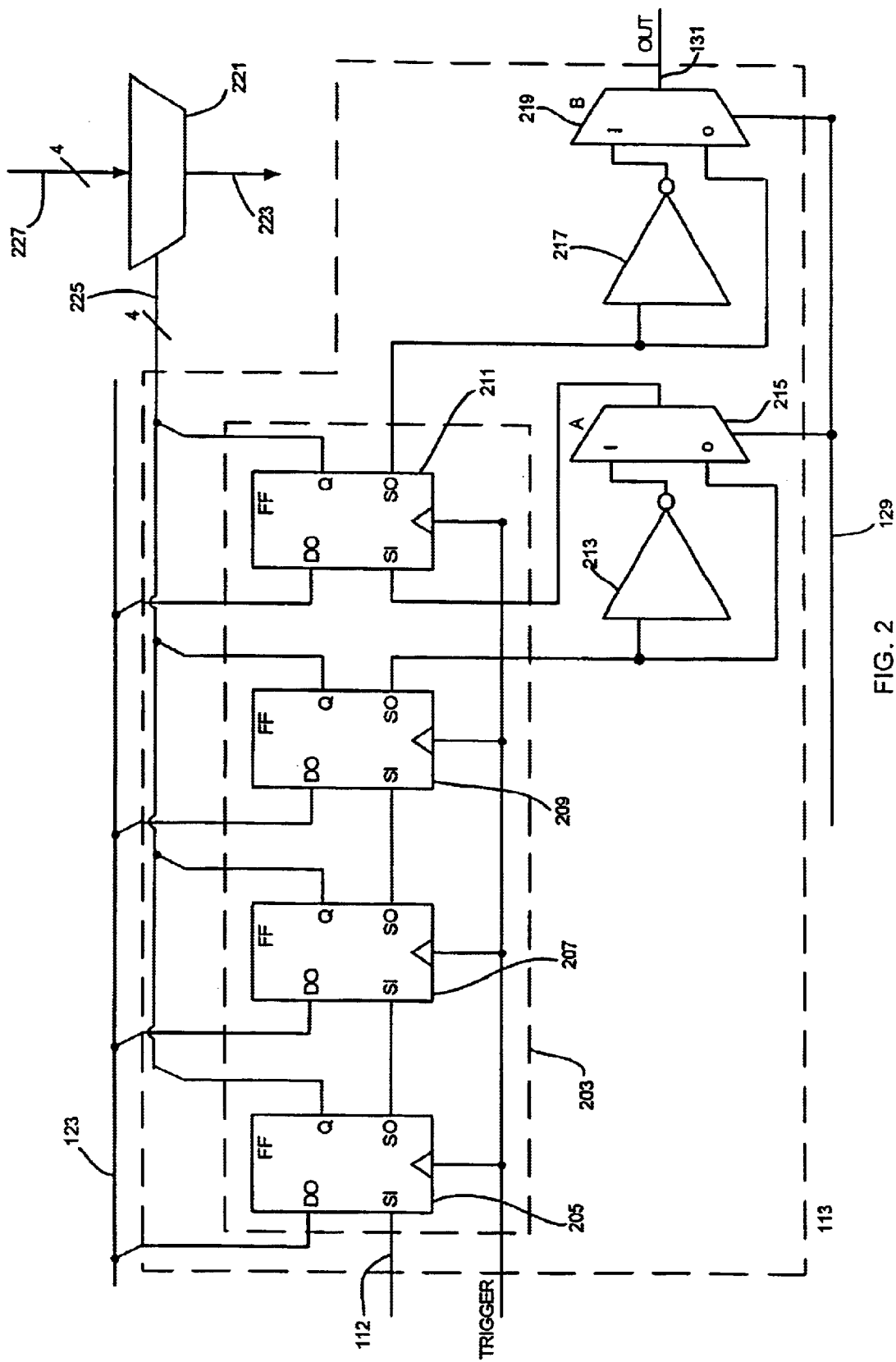
FIG. 2 is a circuit diagram of one embodiment of a 1-hot init circuit in accordance with the present invention.

FIG. 2 is a circuit diagram illustrating one embodiment of a 1-hot init circuit 113 in accordance with the present invention. The 1-hot init circuit 113, a first scan register 203, a first inverter 213, a second inverter 217, a third multiplexer 215, and a fourth multiplexer 219. Each multiplexer 215, 219 includes a first input (e.g., 0), a second input (e.g., 1), and an output.

The first scan register 203 includes two or more state elements. The state elements may be, for example, a logic flip-flop or latch. In one embodiment, the first scan register 203 includes a first flip-flop 205, a second flip-flop 207, a third flip-flop 209, and a fourth flip-flop 211. Each flip-flop 205, 207, 209, 211 includes a trigger (e.g., clock) input, a first input, e.g., a D0, a second input, e.g., SI, a first output, Q, and a second output, S0. In one embodiment the flip-flops are conventional Q-type logic flip-flops.

Generally, the first scan register 203 couples with the trigger (e.g., scan clock) line, the first multiplexer output line 112, the 1-hot select line 123, the first inverter 213, the second inverter 217, the third multiplexer 215, the fourth multiplexer 219, and the 1-hot selection input line 225. More particularly, each flip-flop 205, 207, 209, 211 couples the 1-hot select line 123 through its first input, e.g., D0. The first output, e.g., Q, of each flip-flop 205, 207, 209, 211 couples the 1-hot selection input line 225.

In addition, the first flip-flop couples the first multiplexer output line 112 through its second input, SI. The second output, e.g., S0, of the first flip-flop 205 couples with the second input, e.g., SI, of the second flip-flop 207. The second output, e.g., S0, of the second flip-flop 207 couples with the second input, e.g., SI, of the third flip-flop 209. The second output, e.g., S0, of the third flip-flop 209 couples an input of the first inverter 213 and the second input of the third multiplexer 215 (or A). An output of the first inverter 213 couples the first input of the third multiplexer 215.

The output of the third multiplexer 215 couples the second input, e.g., SI, of the fourth flip-flop 211. The second output of the fourth flip-flop 211 couples an input of the second inverter 217 and the second input of the fourth multiplexer 219 (or B). An output of the second inverter 217 couples the first input of the fourth multiplexer 219. The output of the fourth multiplexer couples the output signal line 131. It is noted that both the third and the fourth multiplexers 215, 219 also couple 1-hot init signal line 129, which acts as an input select line for the multiplexers 215, 219, as described above with regard to the first and the second multiplexers 111, 115.

Figure 3:
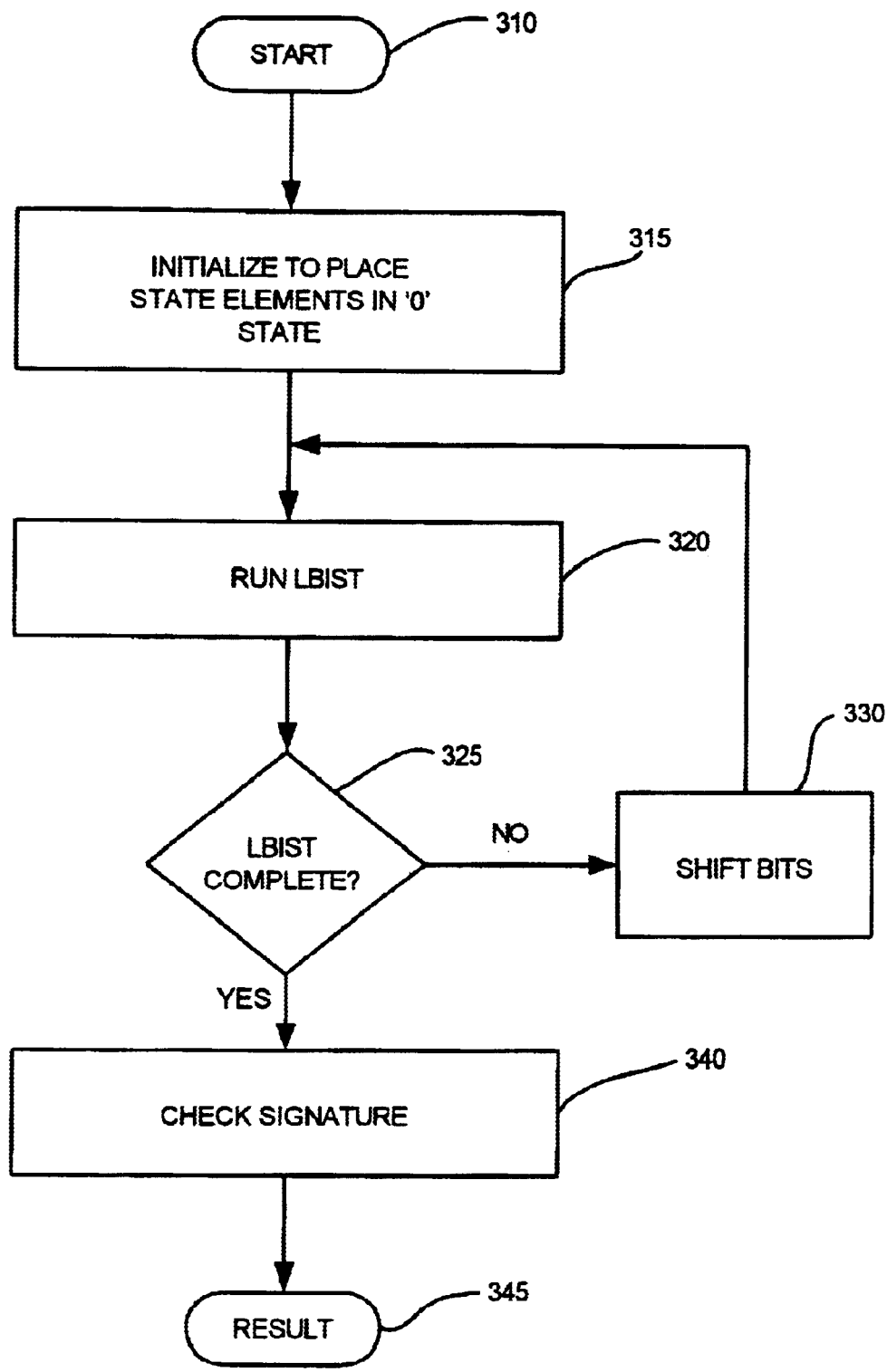
FIG. 3 is a flow diagram of a process for operation of a scan path with regard to a built in logic self-test ("LBIST") circuit in accordance with the present invention.

FIG. 3 is a flow diagram of a process for loading (or operating) the scan path with regard to a built in logic self-test ("LBIST") circuit in accordance with the present invention. It is noted that when the scan path is loaded, the functional path is not loaded. One embodiment of the process will be described through FIG. 3 in conjunction with FIGS. 1 and 2. Upon the start 310 of operation, the scan path process initializes 315 the state elements in the system 101 by flushing the scan path. The state elements include the first and second multiplexer 111, 115 and the components of the 1-hot init circuit 113.

In one embodiment, the process flushes (or initializes) the state elements by asserting a logic high (or logic 1) 1-hot init signal along the 1-hot init signal line 129 to these state elements. The logic high signal along the 1-hot init signal line 129 passes the signal that originates from the pseudo-random pattern generator 105 and the optional scan register X 109 (e.g., the signal may be a logic 0 and for illustration purposes is referred to as a pseudo signal) through the first input of the first multiplexer 111.

The pseudo signal passes through the first three flip-flops 205, 207, 209 in the 1-hot init circuit 113. When the pseudo signal leaves the third flip-flop 209, it is inverted (to, e.g., a logic 1) by the first inverter 213 and is passed by the output of the third multiplexer 215 to the second input, e.g., S1, of the fourth flip-flop 211. The fourth flip-flop 211 stores (or latches) the inverted signal, e.g. logic 1, for the functional path. Further, the inverted pseudo signal is inverted once again by the second inverter 217 and the original pseudo signal passes from the fourth multiplexer 219 to the second multiplexer 115. The second multiplexer 115 sends the pseudo signal to the optional scan register Z 117 and onto the multiple input shift register 119.

Once initialization completes, the process then runs 320 the LBIST. Here, process sends a logic low (or logic 0) 1-hot init signal along the 1-hot init signal line 129. Now, the pseudo signal from the pseudo random pattern generator 105 goes through the optional scan register X 109 and by-passes the first multiplexer 111 and the 1-hot init circuit 113 and goes directly to the second multiplexer 115. The second multiplexer passes the pseudo signal to the scan register Z 117 and onto the multiple input shift-register 119. When the 1-hot init signal is a logic low and the 1-hot init circuit is bypassed, the 1-hot init circuit re-circulates the 1-hot value (e.g., a "0001" with four state elements in the scan register), amongst itself. Those of ordinary skill in the art will appreciate upon reading the disclosure that a similar functional result may be achieved by reversing the logic values provided as examples.

The present invention beneficially ensures that during loading of pseudo random data from, for example, a pseudo random pattern generator 105, a 1-hot condition is guaranteed to a 1-hot multiplexer so as to prevent contention or a high current state. More particularly, the present invention advantageously provides an orthogonal 1-hot select signal along the 1-hot selection signal line 225 to the 1-hot multiplexer 221, while the output from the second multiplexer 115 to the multiple input shift register 119 is valid.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. An apparatus for obtaining valid values during a built-in self-testing of logic ("LBIST"), the apparatus comprising:
   a first multiplexer having a first input, a second input, and an output, the second input of the first multiplexer coupled to receive a data signal;
   a 1-hot init circuit having a first input, a second input, and an output, the first input of the 1-hot init circuit coupled to the output of the first multiplexer and the output of the 1-hot init circuit coupled to the first input of the first multiplexer; and
   a second multiplexer having a first input, a second input, and an output, the second input of the second multiplexer coupled to the output of the 1-hot init circuit and the first input of the second multiplexer coupled to receive the data signal,
   wherein a valid value for the LBIST is obtained through the output of the second multiplexer in response to receipt of the data signal at the first input of the second multiplexer, the data signal being a pseudo-random data signal.

2. The apparatus in claim 1, wherein the data signal further comprises a plurality of bits.

3. The apparatus in claim 2, wherein the first multiplexer, the second multiplexer, and the 1-hot init circuit, each couple to receive a control signal for inverting a bit of the plurality of bits of the data signal before the LBIST.

4. The apparatus in claim 1, wherein the 1-hot init circuit further comprises a scan register having a plurality of successive state elements, each having an input and an output, an input of at least one state element coupled to an output of a subsequent state element and a first state element coupled to receive a data signal generated from a functional logic.

5. The apparatus in claim 4, wherein the 1-hot init circuit further comprises:
   a third multiplexer having a first input, a second input, and an output, the first input of the third multiplexer coupled to receive an inverted output signal from an output of a next to last state element and the second input of the third multiplexer coupled to receive an output signal from the output of the next to last state element, the output of the third multiplexer coupled to an input of a last state element; and a fourth multiplexer, having a first input, a second input, and an output, the first input of the fourth multiplexer coupled to receive an inverted output signal from an output of the last state element and the second input of the fourth multiplexer coupled to receive an output signal from the output of the last state element.

6. The apparatus in claim 5, wherein the inverted output signal received by the third multiplexer is obtained by the output signal passing through an inverter.

7. The apparatus in claim 6, wherein the state element is a latch.

8. The apparatus in claim 6, wherein the output of the fourth multiplexer couples with the second input of the second multiplexer.

9. The apparatus in claim 6, wherein the output of the fourth multiplexer couples with the first input of the first multiplexer.

10. The apparatus in claim 5, wherein the inverted output signal received by the fourth multiplexer is obtained by the output signal passing through an inverter.

11. The apparatus in claim 4, wherein the state element is a flip-flop.

12. A method for having a 1-hot condition during a built-in self-testing of logic ("LBIST"), the method comprising:

initializing a plurality of state elements in a register, each state element of the plurality of state elements to have a first state;

asserting a control signal at the register upon initializing the plurality of state elements;

inverting the first state of a state element of the plurality of state elements in response to asserting the control signal; and providing the first state of each of the plurality of state elements as an input to a select line of a multiplexer having a set of select lines, wherein one select line of the set of select lines has an input that is inverted with respect to the inputs of all other of the select lines.

13. The method for having a 1-hot condition in claim 12, wherein the initializing a plurality of state elements initializes the plurality of state elements to have a second state of an opposite logic state than the first state.

14. The method for having a 1-hot condition in claim 12, wherein the first state is a logic low and the second state is a logic high.

15. (Amended) The method for having a 1-hot condition in claim 12, wherein the inverted first state is shifted from one state element to another until completion of the LBIST.

16. The method for having a 1-hot condition in claim 12, wherein the first state of each of the plurality of state elements is a bit, the plurality of state elements having a plurality of bits, and wherein the inverted state is an inverted bit having the opposite logical value as the bits of the plurality of bits.

17. The method for having a 1-hot condition in claim 16, further comprising recirculating at least one bit of the plurality of bits through a scan register to shift the inverted bit of the plurality of bits until completion of the LBIST.

18. An apparatus for obtaining valid values during a built-in self testing of logic ("LBIST"), the apparatus comprising:

a first means for selecting between a first input signal and a second input signal in response to receiving a trigger signal at a first logical value;

a means for generating the second input signal, the second input signal including a bit having a first logical value in response to receiving the trigger signal at the first logical value;

a second means for selecting between the first input signal and the second input signal in response to receiving the trigger signal at the first logical value; and a means for comparing the first input signal to the second input signal.

19. The apparatus in claim 18, further comprising a coupling means coupling the means for generating the second input signal to the first means for selecting between a first input signal and a second input signal, the second input signal providing a feedback to the means for generating the second input signal through the first means for selecting in response to receiving the trigger signal at a second logic value.

20. The apparatus in claim 18, wherein the means for generating the second input signal further comprises:

a plurality of receiving means for receiving the first input signal, each of the plurality of receiving means coupled with each other;

a first inverting means for inverting the first input signal, the first means coupled between a first and a second receiving means of the plurality of receiving means;

a first selecting means for selecting between the first input signal and the inverted first input signal, the first selecting means coupled to the first inverting means and the second receiving means of the plurality of receiving means, the second receiving means also for storing the inverted first input signal in response to the trigger signal at a first logical value;

a second inverting means for inverting the inverted first input signal, the second inverting means coupled to the second receiving means to receive the inverted first input signal; and a second selecting means for selecting between the inverted first input signal and the first input signal, the second selecting means coupled to the second receiving means and to the second inverting means to receive the first input signal and the inverted first input signal.

21. An init circuit for guaranteeing a 1-select input to a select line of a multiplexer during an LBIST test condition, the init circuit comprising:

a scan register having an input, an output, and a set of state elements, each of the state elements configured to set an initial logic value in response to a hot-init signal being set to a first logic value and configured to provide a test output to the multiplexer select line in response to a trigger signal providing a clock signal to the set of state elements, wherein the initial logic value of one of the state elements is inverted with respect to the initial logic values of the other state elements; and a feedback multiplexer circuit coupled to the output of the scan register and the input of the scan register, the feedback multiplexer circuit configured to re-circulate the output of the scan register to the input of the scan register in response to the hot-init signal being set to a second logic value.

22. The init circuit of claim 21, wherein the multiplexer is a 1-cold, 4-to-1 multiplexer and wherein the test output is a 4 bit output consisting of a logic low bit and three logic high bits.

23. The init circuit of claim 21, wherein the multiplexer is a 1-hot, 4-to-1 multiplexer and wherein the test output is a 4 bit output consisting of a logic high bit and three logic low bits.

24. The init circuit of claim 21, further comprising:

a first multiplexer coupled to the one of the state elements for selecting between the inverted initial logic value and the initial logic value in response to the hot-init signal;

a first inverter coupled to a one of the other state elements and the first multiplexer for inverting the initial logic value from the one of the other state elements and supply the inverted initial logic value to the one of the state elements;

a second multiplexer coupled to the one of the state elements and to the output of the scan register for selecting between the initial logic value and the inverted initial logic value in response to the hot-init signal; and a second inverter coupled to the one of the state elements and to the second multiplexer for inverting the inverted initial logic value back to the initial logic value.

25. The init circuit of claim 24, wherein the one of the state elements is a last state element of the scan register that is coupled to the output of the scan register and wherein the one of the other state elements is a one to the last state element of the scan register that is coupled to the last state element through the first inverter and the first multiplexer.

26. The init circuit of claim 21, wherein the feedback multiplexer circuit further comprises a feedback multiplexer having a select input, the feedback multiplexer coupled to the output of the scan register and the input of the scan register, the feedback multiplexer for selecting between the output of the scan register and a pseudo-random signal in response to the hot-init signal being applied at the select input of the feedback multiplexer.

27. The init circuit of claim 21, wherein the one of the state elements is the last state element of the scan register that is coupled to the output of the scan register.

28. The init circuit of claim 21, wherein the set of state elements are latches.

29. The init circuit of claim 21, wherein the set of state elements are flip-flops.

\* \* \* \* \*